(12) United States Patent
Satomi et al.

(10) Patent No.: US 7,064,451 B2
(45) Date of Patent: Jun. 20, 2006

(54) AREA ARRAY SEMICONDUCTOR DEVICE AND ELECTRONIC CIRCUIT BOARD UTILIZING THE SAME

(75) Inventors: Kunio Satomi, Kanagawa (JP); Yasushi Takeuchi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/686,885

(22) Filed: Oct. 15, 2003

(65) Prior Publication Data

US 2004/0080034 A1 Apr. 29, 2004

(30) Foreign Application Priority Data

Oct. 16, 2002 (JP) .............................. 2002-301774

(51) Int. Cl.
*H01L 23/48* (2006.01)
*H01L 23/52* (2006.01)
*H01L 29/40* (2006.01)

(52) U.S. Cl. .................... 257/787; 257/780; 257/787; 257/E23.11; 257/9

(58) Field of Classification Search ................ 257/787, 257/780, 784, 778, E23, 119
See application file for complete search history.

(56) References Cited

U.S. PATENT DOCUMENTS

| | | | | |
|---|---|---|---|---|
| 5,892,289 A | * | 4/1999 | Tokuno | 257/783 |
| 6,087,716 A | * | 7/2000 | Ikeda | 257/676 |
| 6,177,724 B1 | * | 1/2001 | Sawai | 257/701 |
| 6,303,998 B1 | * | 10/2001 | Murayama | 257/778 |
| 6,350,952 B1 | * | 2/2002 | Gaku et al. | 174/52.2 |

* cited by examiner

*Primary Examiner*—Nitin Parekh
(74) *Attorney, Agent, or Firm*—Morgan & Finnegan, LLP

(57) ABSTRACT

An area array semiconductor device is constituted of a circuit wiring substrate having a circuit wiring and a semiconductor chip mounted on the circuit wiring substrate and electrically connected with the circuit wiring. A sealing layer composed of a sealing resin is formed such that the sealing layer has an angle of 30° to 60° with respect to a side of the circuit wiring substrate.

14 Claims, 1 Drawing Sheet

PRIOR ART

AREA ARRAY SEMICONDUCTOR DEVICE AND ELECTRONIC CIRCUIT BOARD UTILIZING THE SAME

BACKGROUND OF THE INVENTION

1. Field of the Invention

The present invention relates to an area array semiconductor device and an electronic circuit board utilizing the same, and more particularly to prevention of bending of the area array semiconductor device at a soldering operation with solder of a high melting point.

2. Related Background Art

Portable instruments such as a mobile telephone or a video camera have recently advanced in functions and become compact, and various semiconductor devices used therein are required to be thinner and compacter. As a package structure for various multi-pin semiconductor devices for meeting such requirement, there is proposed an area array semiconductor device having a ball grid array (hereinafter, referred to as "area array") composed of plural projected solder balls arranged on a surface in a grid pattern as connection terminals.

In such area array semiconductor device, after a semiconductor chip is electrically connected to a circuit wiring substrate having a circuit wiring (hereinafter, referred to as "interposer"), the semiconductor chip is sealed with a sealant for avoiding contamination and moisture. The sealant can be composed of a ceramic material or a plastic material, but there is widely employed a package formed by a transfer molding method from a plastic material in consideration of mass producibility and cost.

The area array semiconductor device sealed with the plastic material is usually soldered to a host circuit wiring board (hereinafter, referred to as "mother board") represented by a glass-epoxy resin wiring board. For such soldering, there has been employed a lead-containing lead eutectic solder with a melting point as low as 183° C., thus providing the area array with a relatively small thermal stress and not causing a major problem.

However, because of recent environmental concern, use of lead-free solder, not containing lead, is being strongly requested and is rapidly increasing.

Such lead-free solder, requiring a melting point as high as about 220° C. for a high reliability of connection, increases the thermal stress applied to the area array semiconductor device. Because of this fact, the bending of the area array semiconductor device generates at the soldering operation to the mother board, whereby a solder bridging is generated to deteriorate the reliability of soldered connection. Also such defects results in an increase in the cost.

One of the most effective methods for avoiding such problem is to match a thermal expansion coefficient of the interposer with the thermal expansion coefficient of the sealing resin (hereinafter, referred to as "molding resin") provided for protecting the area array semiconductor device from contamination or moisture. However it is difficult to match the thermal expansion coefficients because the former and latter materials are different not only in the composition but also in the configuration.

In such area array semiconductor device, an IC chip is mounted on the interposer, and, after bonding terminals of the IC chip and connection terminals of the interposer with metal wires, a molding is generally executed with a molding resin for protection from contamination and moisture and also for thermal protection. FIG. 2 shows a conventional product paying attention particularly to heat and moisture, and a molding resin 13 is molded with a relatively larger thickness in a state close to the size of the interposer (substrate) 10.

In thus molded area array semiconductor device, because of the differences in the materials and configuration of the interposer and the molding resin, both thermal expansion coefficients are different, whereby the bending of the device is generated by the heat at the soldering operation.

In the conventional soldering with the lead eutectic solder, the soldering temperature is relatively low to thereby cause only a little difference in the thermal expansion between the interposer and the molding resin, whereby the generation of bending of the device is suppressed.

In recent years, because of the requirements for the functions of the products, there are being utilized devices having large package sizes and the device having small package sizes but having small pitches of connection.

However, because of the environmental concern, the solder material is changed from the lead eutectic solders of low melting points to the lead-free solders of high melting points, and such change is causing an increase in the soldering temperature, thus resulting in the bending of the area array semiconductor device and generating a solder bridging phenomenon in the soldering operation of the area array semiconductor device.

The present invention, which has been made in consideration of the foregoing situation, is to provide an area array semiconductor device in which a molding resin is angled with respect to each side of an external periphery of an interposer so that the entire surface of the interposer is sealed by the molding resin, namely a packaging is effected in such a manner that a corner portion of a sealing layer composed of the molding resin is positioned on each side of the interposer, to reduce a contact area of the interposer and the molding resin, and to eliminate the difference in the thermal expansion of the two, thereby suppressing the bending of the area array semiconductor device, eliminating the solder bridging defect and achieving a high soldering reliability.

SUMMARY OF THE INVENTION

An object of the present invention is to provide an area array semiconductor device comprising:

a circuit wiring substrate having a circuit wiring;

a semiconductor chip mounted on the circuit wiring substrate and electrically connected with the circuit wiring; and a sealing layer composed of a sealing resin;

wherein the sealing layer is formed such that the sealing layer has an angle of 30 to 60° with respect to a side of the circuit wiring substrate.

Another object of the present invention is to provide an aforementioned area array semiconductor device in which the semiconductor chip is mounted on the circuit wiring substrate such that the semiconductor chip has substantially the same angle as the angle which the sealing layer composed of the sealing resin has with respect to the side of the circuit wiring substrate.

Still another object of the present invention is to provide an electronic circuit board comprising:

a printed wiring board as a mother board; and the aforementioned area array semiconductor device, wherein the area array semiconductor device is soldered to the printed wiring board as the mother board.

A further object of the present invention is to provide an aforementioned electronic circuit board in which the area array semiconductor device is soldered to the printed wiring board with a lead-free solder.

As explained in the foregoing, the present invention allows to significantly reduce the bending of an area array semiconductor device, generated at a high temperature in a soldering operation with a solder composition of a high melting point.

Also the present invention allows, in an area array semiconductor device, to reduce the bending of the device by a high temperature at a soldering operation, thereby eliminating a solder bridging defect in soldered connections encountered in an external peripheral portion of such device to provide an area array semiconductor device of a high soldering reliability.

DESCRIPTION OF THE PREFERRED EMBODIMENT

In the following, an embodiment of the present invention will be explained in detail with reference to the accompanying drawings.

Figure 1A:
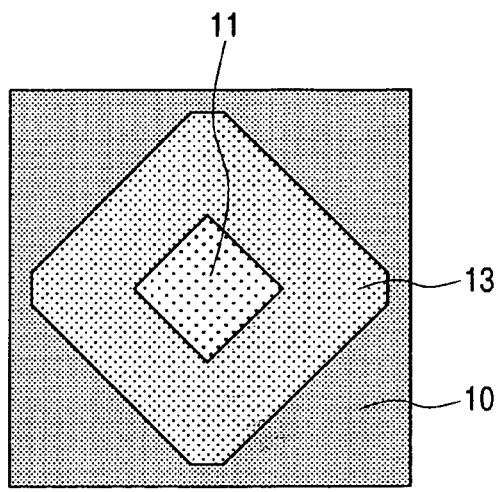
FIGS. 1A and 1B are respectively a plan view and a cross-sectional view showing a first embodiment of the present invention.
Figure 1B:
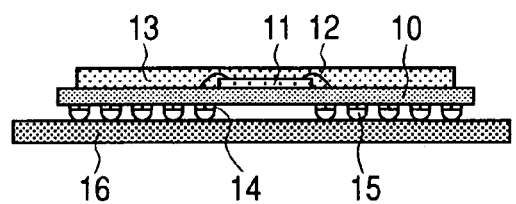

FIGS. 1A and 1B are respectively a plan view and a cross-sectional view showing a most basic embodiment of an area array semiconductor device of the present invention.

In an area array semiconductor device of the present invention shown in FIGS. 1A and 1B, an IC chip 11 is mounted in a central part of an insulating interposer (substrate) 10 which is formed by impregnating a glass cloth with a heat resistant resin such as BT resin, and on which formed are unrepresented signal lines and circuit wirings of connecting lands for electrical connection with the IC chip 11, and the unrepresented connecting lands of the interposer (substrate) 10 and unrepresented connecting lands of the IC chip 11 are bonded by metal wires 12. The circuit wirings of the interposer (substrate) 10 are so formed that the IC chip 11 mounted on the interposer (substrate) 10 is positioned at an angle of 45° with respect to the interposer (substrate) 10.

After the unrepresented connecting lands of the IC chip 11 mounted at an angle of 45° and the unrepresented connecting lands of the interposer (substrate) 10 are bonded by metal wires 12, a molding resin 13 is molded on the IC chip 11 and in the entire periphery of the IC chip 11 mounted at an angle of 45° on the interposer 10 such that the molding resin 13 is angled at the same angle with respect to the interposer 10, as shown in FIG. 1A for the purpose of protection of the IC chip 11 from contamination, moisture and heat and mechanical protection of the metal wires 12.

An area array semiconductor device is finally completed by applying cream solder or flux to copper foil lands 14 for soldering, formed on a surface of the interposer (substrate) 10 opposite to a surface thereof bearing the IC chip 11, then placing spherical solders of a predetermined diameter and thermally fusing the solders to form solder balls.

In soldering the area array semiconductor device of the present invention shown in FIGS. 1A and 1B to a mother board 16 for use in soldering, even in a soldering operation with a lead-free solder of a high melting point, the molding resin 13 showing a large thermal expansion at a high temperature is present with a minimum adjoined portion on each side of the interposer (substrate) 10, thereby eliminating a difference in the thermal expansion between the both. Therefore, even in a soldering operation with the lead-free solder of a high melting point, it is rendered possible to significantly reduce the bending of the area array semiconductor device and to avoid a solder bridging defect at the soldering operation, thereby providing an area array semiconductor device of a high soldering reliability.

EXAMPLE

In the following, an example of the present invention will be explained with reference to the accompanying drawings.

FIGS. 1A and 1B are respectively a plan view and a cross-sectional view of an area array semiconductor device according to the present invention.

In the method of producing the area array semiconductor device of the present invention, comprising the step of mounting an IC chip 11 in a central part of an insulating interposer (substrate) 10 which is formed by impregnating a glass cloth with a heat resistant resin such as BT resin, and on which formed are unrepresented signal lines and circuit wirings of connecting lands for electrical connection, then unrepresented connecting lands of the interposer (substrate) 10, the step of bonding unrepresented connecting lands of the IC chip 11 by metal wires 12, and the step of molding the entire IC chip 11 with a molding resin 13 for the purpose of protection of the IC chip 11 from contamination, moisture and heat and mechanical protection of the metal wires 12, as shown in FIG. 1A, the interposer (substrate) 10 is provided with circuit wirings in such a manner that the IC chip 11 is mounted and adjoined on the interposer (substrate) 10 with an angle of 45° with respect to the interposer (substrate) 10.

The IC chip 11 mounted at an angle of 45° is molded with the molding resin 13 after the wire bonding of the unrepresented connecting lands of the interposer and the IC chip with the metal wires 12, and a metal mold is so formed as to provide a molding at an angle of 45° like the IC chip 11, thereby providing a molded shape shown in FIG. 1A. Although the molding alone may be formed with an angle of 45° with respect to the interposer (substrate) 10, a positioning of also the IC chip 11 at an angle of 45° with respect to the interposer (substrate) 10 provides an effect of reducing the bending of the interposer (substrate) 10 in addition to the effect by the molding resin 13, and also there can be improved a moisture resistance of the IC chip 11.

On a lower surface of the interposer (substrate) 10, there are provided connecting lands 14, on which solder of a predetermined diameter, coated with flux, is placed and fused to form solder balls 15 as shown in FIG. 1B.

Figure 2:
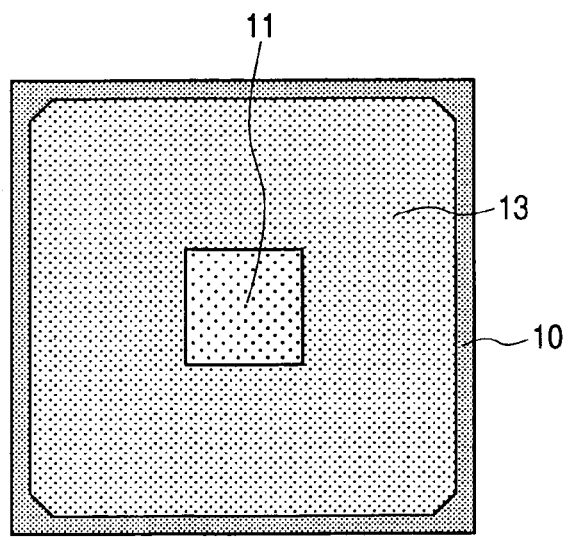
FIG. 2 is a plan view showing a conventional area array semiconductor device.

An area array semiconductor device of the present invention, prepared through the above-described steps, and a conventional area array semiconductor device shown in FIG. 2 were mounted on left and right portions of a test board of a size of 150×200 mm, by feeding lead-free cream solder onto connecting lands of the same pitch as that of the solder balls 15 of the area array semiconductor device, then placing the both area array semiconductor devices and executing a soldering operation with a predetermined soldering temperature profile, and a number of solder bridging and an amount of bending were compared between the area array semiconductor devices.

Following conditions were employed:
1. Area array semiconductor device
   size (interposer): 40 mm×40 mm
   number of balls: 596 balls, arrayed in 6 rows with 30 balls on each side 2. Test board
size: 150 mm×200 mm
mount position: center in each of two longitudinally divided sections
number of mounting: one in each of left and right sections
3. Soldering profile (reflow soldering)
peak temperature at soldered portion: 235° C.
4. Number of tests
50 pieces for each of the sample of the present invention and the conventional sample.

Results of soldering under the aforementioned conditions are shown in Table 1.

TABLE 1

| Area array semi-conductor device | Number of bridging | Bridging rate (%) | Amount of bending of interposer (μm) |
| --- | --- | --- | --- |
| Conventional one | 14/50 | 28 | 350 to 450 |
| Present invention | 0/50 | 0 | 30 to 60 |

These results indicate that, in molding the area array semiconductor device with a molding resin 13, the molding layer 13 was angled with respect to each side of the molding resin 13 in such a manner that the molding resin 13 was not formed on the entire surface of the interposer (substrate) 10, thereby reducing the expansion of the molding resin 13 by the heat at the soldering, significantly suppressing the bending of the interposer (substrate) 10 and also significantly reducing the solder bridging defect.

What is claimed is:

1. An area array semiconductor device comprising:
a circuit wiring substrate having a top face with a circuit wiring;
a semiconductor chip having a top face and a bottom face, the bottom face being mounted on the circuit wiring substrate and at least the top face is electrically connected with the circuit wiring; and
a sealing layer composed of a sealing resin positioned on the entire top face of the semiconductor chip and a portion of the top face of the wiring substrate;
wherein a thickness of the sealing layer on the top face of the semiconductor is smaller than a thickness of the sealing layer on the portion of the top face of the wiring substrate; and
wherein the sealing layer is formed such that a periphery of the sealing layer has an angle of 30° to 60° with respect to a corresponding side of the circuit wiring substrate.

2. An area array semiconductor device according to claim 1, wherein the semiconductor chip is mounted on the circuit wiring substrate such that the semiconductor chip has substantially the same angle as an angle which the side of the sealing layer composed of the scaling resin has with respect to the side of the circuit wiring substrate.

3. An electronic circuit hoard comprising:
a printed wiring board as a mother board; and
an area array semiconductor device according to claim 1, wherein the area array semiconductor device is soldered to the printed wiring board as the mother board.

4. An electronic circuit board according to claim 3, wherein the area array semiconductor device is soldered to the printed wiring board with a lead-free solder.

5. An area array semiconductor device according to claim 1, wherein the semiconductor chip is mounted on the circuit wiring substrate such that a side of the semiconductor chip is arranged parallel to the side of the circuit wiring substrate.

6. An area array semiconductor device comprising:
an insulating interposer having a circuit;
an integrated circuit chip having a top surface and a bottom surface, wherein the bottom surface of the chip is mounted on a top surface of the insulating interposer and at least the top surface of the chip is electrically connected to the circuit of the interposer, the chip having a plurality of sides, each of the sides being at an angle of 30° to 60° with respect to a corresponding side of the interposer;
a resin provided on the entire top surface of the chip and a portion of the top surface of the insulating interposer,
wherein a thickness of the resin on the top surface of the chip is smaller than a thickness of the rosin on the portion of the top surface of the insulating interposer; and
wherein the resin has an outer boundary of a plurality of sides angled at the same angle with respect to the interposer as the integrated circuit chip.

7. An area array semiconductor device according to claim 6, wherein the angle between the sides of the integrated circuit chip and the interposer is 45°.

8. An area array semiconductor device according to claim 6, wherein a periphery of the resin does not extend to a periphery of the interposer.

9. An electronic circuit board comprising:
a printed wiring board;
an insulating interposer defining an upper and a lower surface, the interposer having a plurality of connecting lands and a plurality of solder balls providing electrical connection to the wiring board; the interposer also having a circuit;
an integrated circuit chip having an upper surface and a lower surface, wherein the lower surface of the chip is in contact with the upper surface of the interposer and at least the upper surface is electrically connected to the circuit of the interposer, and the chip has a plurality of sides, each of the sides being at an angle of 30° to 60° with respect to a corresponding side of the interposer;
a protective material provided on the entire upper surface of the chip and a portion of the upper surface of the insulating interposer, which is adapted, in conjunction with the insulating interposer, to provide protection from contamination and moisture in the atmosphere, and the material having an outer boundary of a plurality of sides angled at the same angle with respect to the interposer as the integrated circuit chip,
wherein a thickness of die protective material on the top face of the chip is smaller than a thickness of the resin on the portion of the top surface of the insulating interposer.

10. An electronic circuit board according to claim 9, wherein the solder balls arc made from a lead-free solder having a melting point greater than 183° C.

11. An electronic circuit board according to claim 10, wherein the solder balls have a melting point of 220° C.

12. An electronic circuit board according to claim 9, wherein the material also provides thermal insulation for the chip.

13. An electronic circuit board according to claim 9, wherein the material is applied to the upper surface of the interposer and entirely encapsulates the chip between the material and the interposer.

14. An electronic circuit board according to claim 9, wherein the material is a moldable material.

* * * * *